United States Patent
Xu et al.

(10) Patent No.: US 9,773,938 B2
(45) Date of Patent: Sep. 26, 2017

(54) MANUFACTURING METHOD OF AN AMORPHOUS-SILICON FLAT-PANEL X-RAY SENSOR

(71) Applicant: Beijing BOE Optoelectronics Technology Co., Ltd., Beijing (CN)

(72) Inventors: Shaoying Xu, Beijing (CN); Zhenyu Xie, Beijing (CN); Jian Guo, Beijing (CN); Xu Chen, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 13/995,424

(22) PCT Filed: Oct. 29, 2012

(86) PCT No.: PCT/CN2012/083711
§ 371 (c)(1),
(2) Date: Jun. 18, 2013

(87) PCT Pub. No.: WO2013/189139
PCT Pub. Date: Dec. 27, 2013

(65) Prior Publication Data
US 2014/0087510 A1    Mar. 27, 2014

(30) Foreign Application Priority Data

Jun. 18, 2012 (CN) .......................... 2012 1 0206267

(51) Int. Cl.
*H01L 21/84* (2006.01)
*H01L 31/18* (2006.01)
(Continued)

(52) U.S. Cl.
CPC ........ *H01L 31/18* (2013.01); *H01L 27/14603* (2013.01); *H01L 27/14658* (2013.01); *H01L 27/14692* (2013.01); *H01L 31/1055* (2013.01)

(58) Field of Classification Search
CPC ... H01L 31/186; H01L 31/1872; H01L 51/42; H01L 31/00
See application file for complete search history.

(56) References Cited

U.S. PATENT DOCUMENTS 5,619,033 A * 4/1997 Weisfield .......... H01L 27/14643
250/208.1
5,873,003 A * 2/1999 Inoue ..................... G02B 7/287
257/E27.136
(Continued)

FOREIGN PATENT DOCUMENTS

CN    101900825 A    12/2010
CN    102023425 A    4/2011
(Continued)

OTHER PUBLICATIONS

First Office Action issued by the Chinese Patent Office for Chinese Patent Application No. 201210206267.7 dated Apr. 10, 2014, 7pgs.
(Continued)

*Primary Examiner* — Zandra Smith
*Assistant Examiner* — Andre' C Stevenson (57) ABSTRACT

An embodiment of the present invention provides a manufacturing method of an amorphous-silicon flat-panel X-ray sensor; the method reduces the number of mask plates to be used, simplifies the production processes, saves production costs, while also improving the product yield. The manufacturing method comprises: on a substrate, after a gate scan line is formed, forming a data line, a TFT switch element and a photosensitive element through one patterning process, wherein on the mask plate used in the patterning process, a region corresponding to a channel of the TFT switch element
(Continued)

is semi-transmissive, whereas regions respectively corresponding to the data line, the photosensitive element and the portion of the TFT switch element other than the channel thereof are non-transmissive; thereafter, on the substrate formed with the TFT switch element and the photosensitive element, a passivation layer and a bias line are formed.

15 Claims, 6 Drawing Sheets (51) Int. Cl.
    *H01L 31/105* (2006.01)
    *H01L 27/146* (2006.01)

(56) References Cited

U.S. PATENT DOCUMENTS

| | | | | |
|---|---|---|---|---|
| 6,151,730 | A * | 11/2000 | Weston | A47C 19/122 5/110 |
| 7,005,331 | B2 * | 2/2006 | Chen | H01L 29/66765 257/E21.414 |
| 7,321,404 | B2 * | 1/2008 | Kawasaki | G02F 1/1362 257/59 |
| 8,263,447 | B2 * | 9/2012 | Chiu | H01L 27/1214 257/88 |
| 8,395,717 | B2 * | 3/2013 | Nakamura | G02F 1/136209 349/43 |
| 8,497,002 | B2 * | 7/2013 | Matsui | G02F 1/133723 349/129 |
| 8,530,899 | B2 * | 9/2013 | Harumoto | H01L 29/66765 257/258 |
| 2001/0013577 | A1 | 8/2001 | Choo et al. | |
| 2002/0167636 | A1 | 11/2002 | Yasuda et al. | |
| 2004/0147058 | A1 | 7/2004 | Shih | |
| 2005/0062704 | A1 | 3/2005 | Whittington et al. | |
| 2006/0187160 | A1 | 8/2006 | Lai | |
| 2007/0114625 | A1 | 5/2007 | Hsiao et al. | |

FOREIGN PATENT DOCUMENTS

| | | |
|---|---|---|
| CN | 102110421 A | 6/2011 |
| CN | 102629613 A | 8/2012 |
| CN | 102708821 A | 10/2012 |
| CN | 102751300 A | 10/2012 |
| JP | 2002341375 A | 11/2002 |
| JP | 2006154577 A | 6/2006 |
| KR | 20010066258 A | 7/2001 |
| KR | 20070108969 A | 11/2007 |
| TW | 200622999 A | 7/2006 |

OTHER PUBLICATIONS

English translation of First Office Action issued by the Chinese Patent Office for Chinese Patent Application No. 201210206267.7 dated Apr. 10, 2014, 6pgs.
International Search Report for International Application No. PCT/CN2012/083711, 12pgs.
English translation of Chinese Publication No. CN101900825, 27pgs.
English translation of Chinese Publication No. 102751300, 24pgs.
English translation of Korean Publication No. 20010066258, 15pgs.
International Search Report for International Application No. PCT/CN2013/080850, 11pgs.
English abstract of CN102708821A, listed above, 1 page.
First Office Action (Chinese language) issued by the State Intellectual Property Office ("SIPO") dated Oct. 10, 2014 for International Application No. 201310214465.2, 6 pages.
English translation of first Office Action issued by SIPO (listed above) for International Application No. 2013102144651, 7 pages.
International Preliminary Report on Patentability issued by The International Bureau of WIPO dated Dec. 23, 2014 for International Application No. PCT/CN2012/083711, 9 pages.
Korean Office Action issued by the Korean Patent Office for Korean Patent Application No. 10-2013-0084737 dated Jun. 30, 2014, 5pgs.
English translation of Korean Office Action issued by the Korean Patent Office for Korean Patent Application No. 10-2013-0084737 dated Jun. 30, 2014, 3pgs.
First Office Action issued by the Chinese Patent Office for Chinese Patent Application No. 201210358702.8 for Chinese Patent Application No. 201210358702.8 dated Jul. 2, 2014, 9pgs.
English translation of First Office Action issued by the Chinese Patent Office for Chinese Patent Application No. 201210358702.8 for Chinese Patent Application No. 201210358702.8 dated Jul. 2, 2014, 7pgs.
Extended European Search Report for European Patent Application No. 13174198.5 dated Jan. 20, 2014.

* cited by examiner

MANUFACTURING METHOD OF AN AMORPHOUS-SILICON FLAT-PANEL X-RAY SENSOR

CROSS REFERENCE TO RELATED APPLICATIONS

This application is based on International Application No. PCT/CN2012/083711 filed on Oct. 29, 2012, which claims priority to Chinese National Application No. 201210206267.7, filed on Jun. 18, 2012, the contents of which are incorporated herein by reference.

TECHNICAL FIELD

Embodiments of the present invention relate to a manufacturing method of an amorphous-silicon flat-panel X-ray sensor.

BACKGROUND

Figure 1:
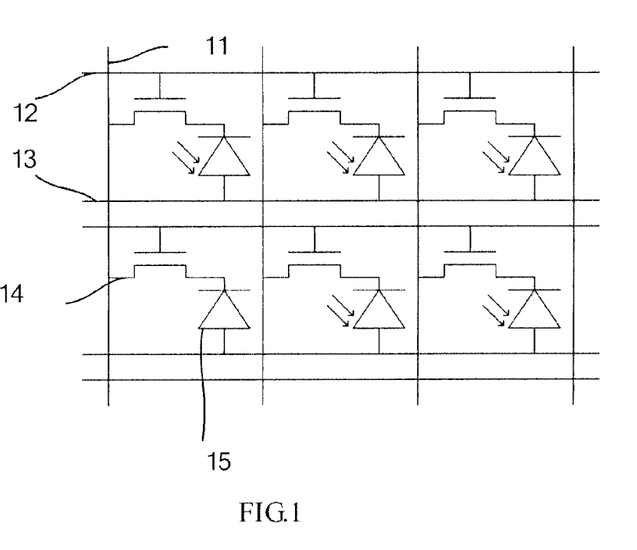
FIG. 1 is a circuit configuration diagram of an amorphous-silicon flat-panel X-ray sensor after completion of the processes according to an embodiment of the present invention.

Thin-film transistor (TFT) flat-panel X-ray sensors are vital components in digital imaging technology, and applied in chest X-ray, CT (computed tomography) and other fields. FIG. 1 shows a circuit configuration diagram of an amorphous-silicon TFT flat-panel X-ray sensor. The flat-panel X-ray sensor comprises a matrix composed of a plurality of pixel units. Each pixel unit comprises a photodiode 15 and a field-effect transistor (FET) 14. Each field-effect transistor 14 is connected to an adjacent gate scan line 12; each photodiode 15 is connected, via the FET 14 within a same pixel unit, to a data line 11 adjacent to that FET. In a matrix composed of a plurality of pixel units, for the respective FETs 14 in each row of pixel units, the gates are connected to a gate scan line 12 in that row, the sources are respectively connected to corresponding data lines 11, and the drains are connected to the negative terminals of the photodiodes 15. The positive terminals of the photodiodes 15 are respectively connected to bias lines 13. Each gate scan line is connected to a gate-control unit, and each data line 11 is connected to a source-control unit.

In the existing technology, 10 masking processes (photolithography processes) are usually needed to prepare an amorphous-silicon flat-panel X-ray sensor. The application of the masking processes makes the whole preparation procedure costly and complex; and the processes cause yield to decline and equipment capacity to decrease.

SUMMARY

An embodiment of the present invention provides a manufacturing method of an amorphous-silicon flat-panel X-ray sensor, and during the production of the flat-panel X-ray sensor, the method can reduce the number of mask plates to be used, simplify the production processes, and improve the product yield.

An aspect of the present invention provides a manufacturing method of an amorphous-silicon flat-panel X-ray sensor, and the method comprises: on a substrate, forming a pattern including a gate electrode and a gate scan line; on the substrate formed with the gate electrode and the gate scan line, forming a data line, a TFT switch element and a photosensitive element; on the substrate formed with the data line, the TFT switch element and the photosensitive element, forming a passivation layer and a bias line.

In the manufacturing method, for example, forming of a data line, a TFT switch element and a photosensitive element on the substrate formed with the gate electrode and the gate scan line comprises: forming the data line, the TFT switch element and the photosensitive element through one masking process, wherein on the mask plate used in the masking process, a region corresponding to a channel of the TFT switch element is semi-transmissive and used to obtain a photoresist-partially-retained region; a region corresponding to the data line, the photosensitive element and the portion of the TFT switch element other than the channel thereof is non-transmissive and used to obtain a photoresist-fully-retained region; and, except the region corresponding to the channel of the TFT switch element, the region corresponding to the data line and the region corresponding to the photosensitive element, a rest region is fully-transmissive and used to obtain a photoresist-completely-removed region.

In the manufacturing method, for example, forming of a data line, a TFT switch element and a photosensitive element through one masking process, comprises: on the substrate formed with the gate electrode and the gate scan line, sequentially forming a gate insulating layer film, an active layer film, an ohmic contact layer film, a data-line-and-source-drain metal layer film, an amorphous-silicon layer film, a transparent electrode layer film, and a photoresist layer film; with the mask plate used in the masking process, exposing and developing the photoresist layer so that a photoresist pattern is obtained, which comprises the photoresist-completely-removed region, the photoresist-partially-retained region and the photoresist-fully-retained region; in the photoresist-completely-removed region, etching off the transparent electrode layer film, the amorphous-silicon layer film, the data-line-and-source-drain metal layer film, the ohmic contact layer film and the active layer film; then, in the photoresist-partially-retained region, removing the photoresist to uncover the channel, and in the uncovered region, etching the transparent electrode layer film, the amorphous-silicon layer film and the source-drain metal layer film to form the channel of the TFT switch element; and then, in the photoresist-fully-retained region, removing the photoresist so that the data line, the TFT switch element and the photosensitive element are uncovered.

In the manufacturing method, for example, after etching the transparent electrode layer film, the amorphous-silicon layer film and the data-line-and-source-drain metal layer film in the uncovered region in the photoresist-partially-retained region to form the channel of the TFT switch element, the method further comprises: etching off the amorphous-silicon layer film on the data-line-and-source-drain metal layer of the TFT switch element.

In the manufacturing method, for example, the amorphous-silicon layer comprises, sequentially laminated, an n-type amorphous-silicon layer, an intrinsic amorphous-silicon layer and a p-type amorphous-silicon layer.

In the manufacturing method, for example, the gate electrode and the gate scan line are made of molybdenum, aluminum, tungsten, titanium, copper, or an alloy of any two of the aforementioned metals, and in a monolayer film or a multi layer film, and, for example, have a thickness of 100 nm~500 nm.

In the manufacturing method, for example, the gate insulating layer film is made of silicon nitride or silicon oxide, and has a thickness of 250 nm~600 nm.

In the manufacturing method, for example, the active layer film is made of n-type amorphous-silicon, and has a thickness of 30 nm~300 nm.

In the manufacturing method, for example, the ohmic contact layer film has a thickness of 30 nm~100 nm.

In the manufacturing method, for example, in the amorphous-silicon thin film, the n-type amorphous-silicon thin-film layer has a thickness of 30 nm~100 nm, and the intrinsic amorphous-silicon thin-film layer has a thickness of 100 nm~2000 nm.

In the manufacturing method, for example, forming of a passivation layer and a bias line on the substrate formed with the TFT switch element and the photosensitive element, comprises: on the substrate formed with the TFT switch element and the photosensitive element, forming the passivation layer through one masking process, wherein the mask plate used in the masking process is non-transmissive except a photosensitive-element region and a via hole region; and forming the bias line on the passivation layer.

In the manufacturing method, for example, the passivation layer film in the switch element is made of non-photosensitive resin, silicon nitride or silicon oxide, and has a thickness of 150 nm~2500 nm, for example.

In the manufacturing method, for example, the bias line layer film is made of indium-tin oxide (ITO) or indium-zinc oxide (IZO), and has a thickness of 30 nm~120 nm, for example.

The embodiment of the present invention provides a manufacturing method of an amorphous-silicon flat-panel X-ray sensor, and during the preparation of the flat-panel X-ray sensor, the method can reduce the number of mask plates to be used, simplify the production processes, and improve the product yield, for example by having an active layer, an ohmic contact layer, a data-line-and-source-drain metal layer, a p-type amorphous-silicon layer, an intrinsic amorphous-silicon layer, an n-type amorphous-silicon layer and a transparent electrode layer formed by being subjected to different degrees of exposure with the use of a same mask plate and then etched.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention clear, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A flat-panel X-ray sensor prepared according to an embodiment of the present invention comprises a matrix composed of a plurality of pixel units. Each pixel unit comprises, for example, a photodiode for performing photoelectric conversion to generate photocharges, and a thin-film transistor (TFT) acting as a switch element. Each thin-film transistor is connected to an adjacent gate scan line; each photodiode is connected, via the thin-film transistor within a same pixel unit, to a data line adjacent to that thin-film transistor. In the matrix composed of a plurality of pixel units, for example, for the respective thin-film transistors in each row of pixel units, the gates are connected to a gate scan line in that row, the sources are respectively connected to corresponding data lines, and the drains are connected to the negative terminals of the photodiodes. For example, the positive terminals of the photodiodes are connected to corresponding bias lines. Each gate scan line is connected to a gate-control unit, and each data line is connected to a source-control unit.

Unless otherwise defined, technical or scientific terms used herein should be interpreted in the usual sense as understood by those ordinary skilled in the relevant art of the present invention. The terms "first", "second", and the like, used in the specification and claims of this patent application of the invention, do not denote any order, quantity, or importance, but are used to distinguish among different integral parts. Similarly, the wordings "a," "an," "the" and the like herein do not denote a limitation of quantity, but denote the presence of at least one of the referenced item. The terms such as "connection" or "interconnection" or the like, are not limited to physical or mechanical connections, but may comprise electrical connection, whether direct or indirect. The terms such as "upper", "lower", "left", "right" and the like, are only used to indicate a relative positional relationship, which may be correspondingly changed as an absolute position of a described object is changed.

Figure 2:
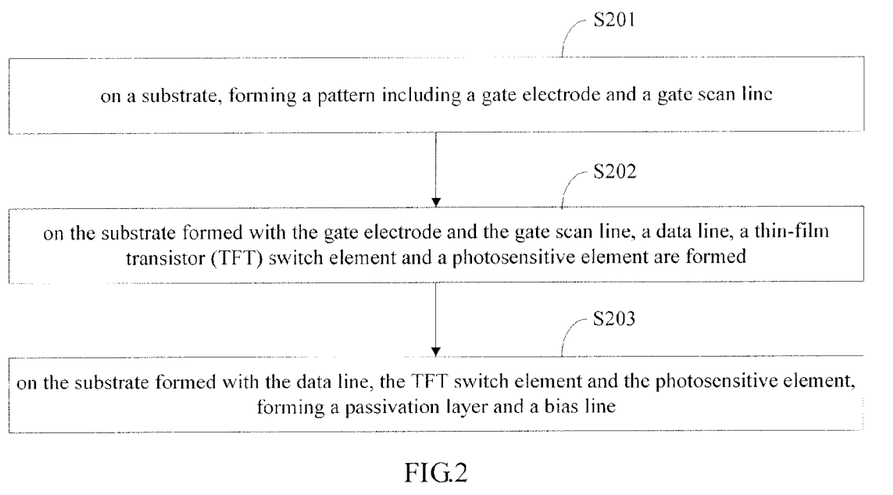
FIG. 2 is a flowchart of the processes according to an embodiment of the present invention.

Hereinafter, specific processes in accordance with an embodiment of the invention will be explained in connection with the accompanying drawings. As shown in FIG. 2, the processes in accordance with the embodiment of the invention comprise the following steps.

Step S201: on a substrate forming a pattern including a gate electrode and a gate scan line.

Step S202: on the substrate formed with the gate electrode and the gate scan line, forming a data line, a TFT switch element and a photosensitive element.

Step S203, on the substrate formed with the data line, the TFT switch element and the photosensitive element, forming a passivation layer and a bias line.

Figure 3:
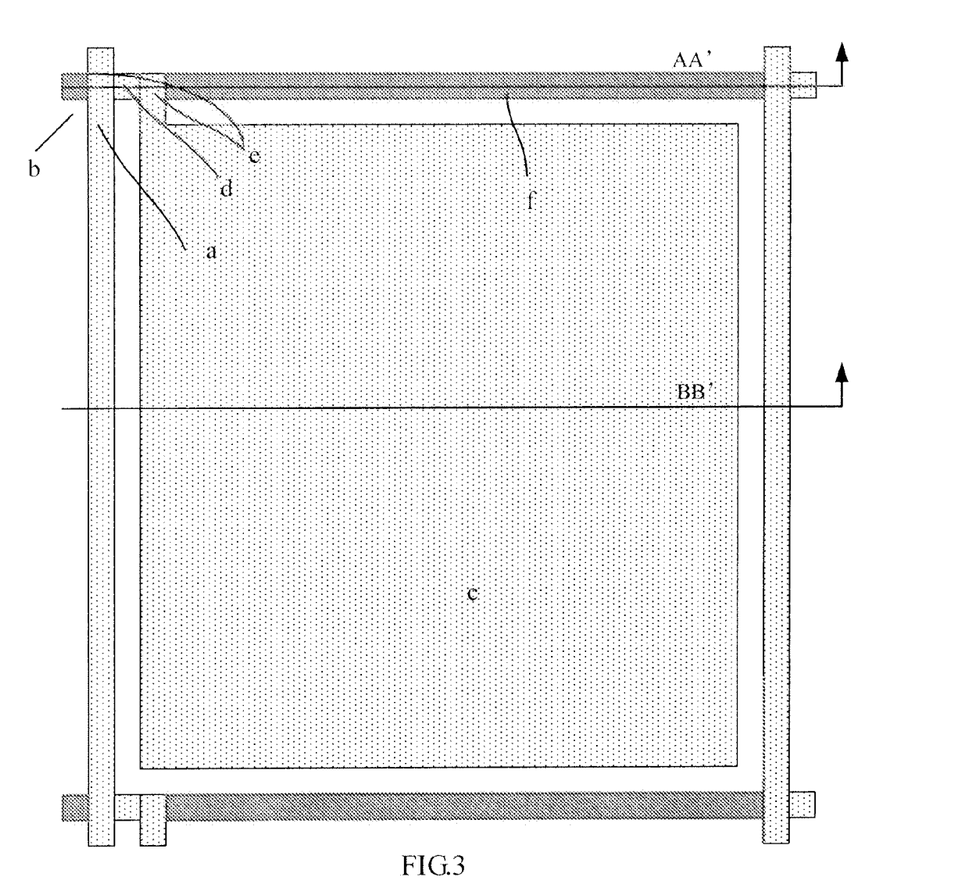
FIG. 3 is a top view of a pixel unit after completion of the processes according to a specific example of the present invention.

FIG. 3 shows a top view of a pixel unit after completion of the processes according to the embodiment of the present invention. Each pixel unit comprises: a data line a, a switch element b, a photosensitive element c, and a gate scan line f. The switch element b comprises a channel d and a source-drain region e therein.

For the purpose of easy explanation of the processes of the embodiment, the manufacturing method of an amorphous-silicon flat-panel X-ray sensor in accordance with the embodiment of the invention will be explained with reference to sectional views along two directions, AA' and BB', in the structural diagram shown in FIG. 3 respectively, and the manufacturing method comprises the steps as follows.

Figure 4A:
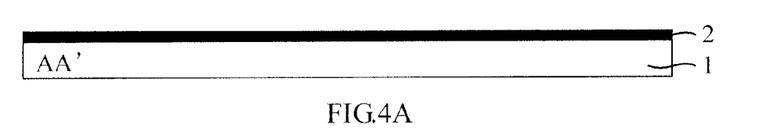
FIG. 4A is a schematic sectional view after formation of a gate scan line, in the processes according to the specific example of the present invention, taken along a line AA' (in FIG. 3)
Figure 4B:
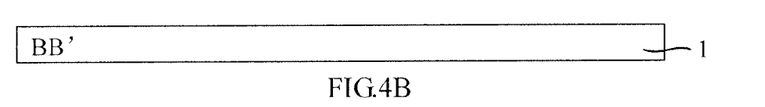
FIG. 4B is a schematic sectional view after formation of a gate scan line, in the processes according to the specific example of the present invention, taken along a line BB' (in FIG. 3)

Firstly, as shown in FIGS. 4A and 4B, a gate electrode (not shown) and a gate scan line 2 (as shown in FIG. 3, located in the region f) are formed on a substrate.

The gate electrode and the gate scan line 2 are formed on the substrate 1 through a patterning process. For example, in the case of using positive photoresist, the mask plate used in the patterning process is transmissive except the regions of the gate electrode and of the gate scan line 2.

In this step, the thin film for both the gate electrode and the gate scan line 2 is formed on the entire substrate 1.

The substrate described in the embodiment may be a glass substrate, a quartz substrate, or other transparent substrate. The process used for forming the thin film may be a process such as depositing, coating, sputtering, or the like.

With a patterning process, the gate electrode (not shown) and the gate scan line 2 (as shown in FIG. 4A) are formed. As shown in FIG. 4B, in the region BB', the thin film used for forming both the gate electrode and the gate scan line 2 is not retained.

The patterning process may comprise processes such as masking, exposing, developing, etching, etc.

The material for forming the thin film for both the gate electrode and the gate scan line may be molybdenum, aluminum, tungsten, titanium, copper, or an alloy of any two of the aforementioned metals, or may be a monolayer film or a multilayer film of the aforementioned metals or an alloy thereof. A multilayer film may comprise two different metal layers, for example, a first layer of molybdenum and a second layer of aluminum, which together constitute the thin film for forming both the gate electrode and the gate scan line. There are numerous types of metals that can be used for the gate electrode and the gate scan line. Nevertheless, in order to improve the stability and the adhesion of the gate scan line, in actual manufacture processes, the material can be selected based on metallic properties, or a metallic alloy is adopted.

The thin film for both the gate electrode and the gate scan line has a thickness of 100 nm~500 nm, for example. The thickness of the metal for both the gate electrode and the gate scan line is controlled to be within a certain range, and this can avoid resulting in a too-high step in the production of a flat-panel X-ray sensor.

It should be noted that, it is also possible that the patterning process may be not conducted by the processes of first forming a thin film for each film layer on a substrate and then performing a photolithography process; instead, it may adopt a process such as printing, screen printing, etc, to directly form a pattern of each film layer on the substrate.

Secondly, with a patterning process, a gate insulating layer, a TFT switch element, a data line, and a photosensitive element are formed. The mask plate used in this patterning process is a gray-scale mask plate (e.g., a dual-tone or half-tone mask plate); on the mask plate, the region corresponding to the channel of the TFT switch element is semi-transmissive, and the region corresponding to the data line, the photosensitive element and the portion of the TFT switch element other than the channel thereof is non-transmissive, and the rest region, except the region corresponding to the channel of the TFT switch element, the region corresponding to the data line, the region corresponding to the photosensitive element, and the region corresponding to the portion of the TFT switch element other than the channel thereof, is fully-transmissive.

The patterning process comprises, for example: on the substrate formed with the gate electrode and the gate scan line, sequentially forming a gate insulating layer film, an active layer film, an ohmic contact layer film, a data-line-and-source-drain metal layer film, an amorphous-silicon layer film, and a transparent electrode layer film, and then patterning the laminate of these films.

Figure 5A:
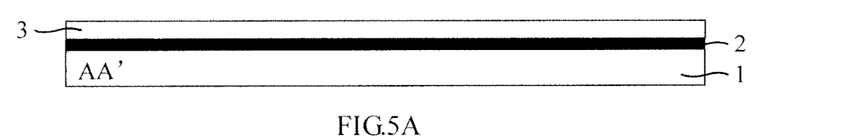
FIG. 5A is a schematic sectional view after formation of a gate insulating layer, in the processes according to the specific example of the present invention, taken along the line AA' (in FIG. 3)
Figure 5B:
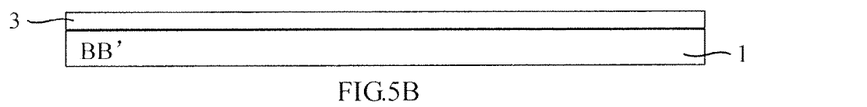
FIG. 5B is a schematic sectional view after formation of a gate insulating layer, in the processes according to the specific example of the present invention, taken along the line BB' (in FIG. 3)

The gate insulating layer film 3 is formed to cover the entire substrate 1, as shown in FIGS. 5A and 5B. The process for forming this film may be a process such as depositing, coating, sputtering, or the like. The gate insulating layer may be a thin film made of silicon nitride or silicon oxide, etc. Both silicon nitride and silicon oxide are good for the insulating film.

On the substrate formed with the transparent electrode layer, as described above, a photoresist layer is formed. A gray-scale mask plate is provided for the exposure of the photoresist, so that the photoresist corresponding to the non-transmissive region of the gray-scale mask plate is unexposed, the photoresist corresponding to the semi-transmissive region of the gray-scale mask plate is half-exposed, and the photoresist corresponding to the fully-transmissive region of the gray-scale mask plate is fully-exposed. Here, the half-exposed region of the mask is, for example, a semi-transmissive region, i.e., a region having an exposure rate of about 50%, which certainly also may be 60% or 70% instead; the exposure rate of the half-exposed region of the mask is selected based on the requirements of the process.

An explanation given below is still with the example of positive photoresist. The photoresist that is exposed is developed; and thus the photoresist in the unexposed region is fully retained, the photoresist in the half-exposed region is partially retained, and the photoresist in the fully-exposed region is completely removed. It should be noted that, the phrase "photoresist being fully retained" as used herein, just means that the majority of the photoresist is retained, but does not mean that the photoresist is retained without any loss.

In the photoresist-completely-removed region, the amorphous-silicon layer film, the data-line-and-source-drain metal layer film, the ohmic contact layer film, the active layer film and the transparent electrode layer film, correspondingly, are then etched and completely removed.

After the portion of the laminate that does not need to be retained is removed by wet-etching or dry-etching, then the data-line-and-source-drain metal layer can be formed.

An ashing process is conducted onto the photoresist in the photoresist-partially-retained region (i.e., the photoresist-half-exposed region), and therefore the photoresist in the photoresist-partially-retained region is completely removed, so that the channel is uncovered, while the photoresist in the photoresist-fully-retained region is partially retained; then, in the photoresist-partially-retained region, the amorphous-silicon layer film and the data-line-and-source-drain metal layer film, correspondingly, are etched to form the channel of the TFT switch element.

The photoresist in the photoresist-fully-retained region is removed; and with the patterning processes, the corresponding layer films in the photoresist-fully-retained region are patterned; and, finally the data line, the TFT switch element and the photosensitive element are formed.

With the above-described steps, a data line, a TFT switch element and a photosensitive element can be formed by one masking process.

In this embodiment of the invention, the amorphous-silicon layer, from the bottom to the top, comprises: an n-type amorphous-silicon layer, an intrinsic amorphous-silicon layer, and a p-type amorphous-silicon layer; and the laminate is used for forming a photoelectric-conversion structure layer of the photodiodes. The thin film of the transparent electrode layer may be indium-tin oxide (ITO), but not limited to ITO, and also may be indium-zinc oxide (IZO), tin oxide (SnO2), or other transparent conductive thin film.

In the data-line-and-source-drain metal layer, the data line is connected with the source of the TFT switch element; the source-drain of the TFT switch element is conductively-connected to the ohmic contact layer and the active layer at the channel position. In the data-line-and-source-drain metal layer, the drain of the TFT switch element is connected with the photosensitive element.

In this embodiment, a specific example of this step is described as below.

Figure 6A:
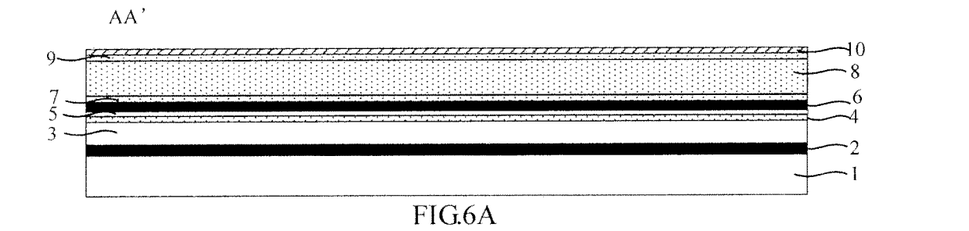
FIG. 6A is a schematic sectional view after deposition of each layer to be exposed with one mask, in the processes according to the specific example of the present invention, taken along the line AA' (in FIG. 3)
Figure 6B:
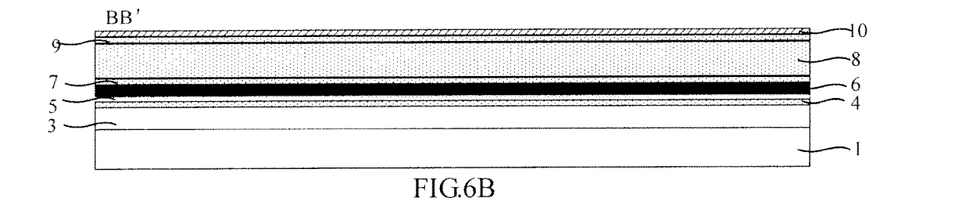
FIG. 6B is a schematic sectional view after deposition of each layer to be exposed with one mask, in the processes according to the specific example of the present invention, taken along the line BB' (in FIG. 3)

On the substrate formed with a gate electrode and a gate scan line, the following films are sequentially formed: a gate insulating layer film 3, an active layer film 4, an ohmic contact layer film 5, a data-line-and-source-drain metal layer 6, an n-type amorphous-silicon layer film 7, an intrinsic amorphous-silicon layer film 8, a p-type amorphous-silicon layer film 9, and a transparent electrode layer film 10. The laminate structure thus formed is as shown in FIGS. 6A and 6B.

Figure 7A:
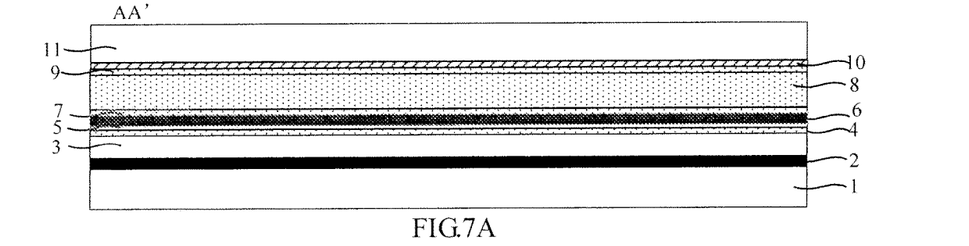
FIG. 7A is a schematic sectional view of each deposited layer to be exposed with one mask plate after application of photoresist, in the processes according to the specific example of the present invention, taken along the line AA' (in FIG. 3)
Figure 7B:
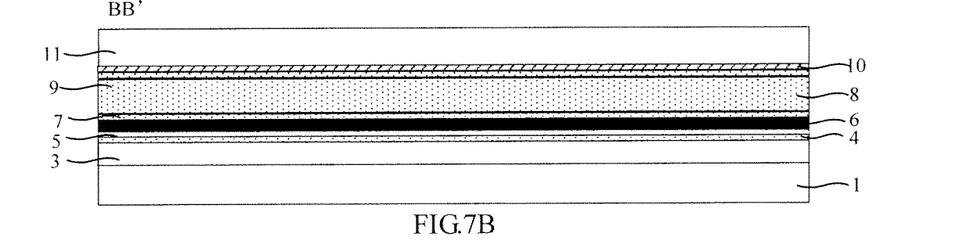
FIG. 7B is a schematic sectional view of each deposited layer to be exposed with one mask plate after application of photoresist, in the processes according to the specific example of the present invention, taken along the line BB' (in FIG. 3)

A photoresist layer 11 is formed on the transparent electrode layer film 10, as shown in FIGS. 7A and 7B.

With a gray-tone mask plate, the photoresist 11 is exposed. The photoresist corresponding to the region of the channel d of the TFT switch element b is half-exposed, and after a developing process, this portion of photoresist is partially retained; the photoresist corresponding to the data line a, the photosensitive element c and the portion in the TFT switch element b other than the channel d thereof, is not subjected to exposure, and after the developing process, this portion of photoresist is fully retained; the photoresist corresponding to the rest region other than the above-mentioned regions is fully exposed, and after the developing process, this portion of photoresist is completely removed.

Figure 8A:
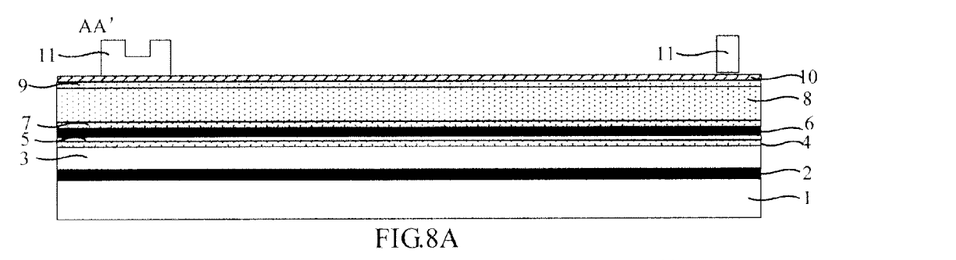
FIG. 8A is a schematic sectional view of each layer to be exposed with one mask plate after exposure of the photoresist, in the processes according to the specific example of the present invention, taken along the line AA' (in FIG. 3)
Figure 8B:
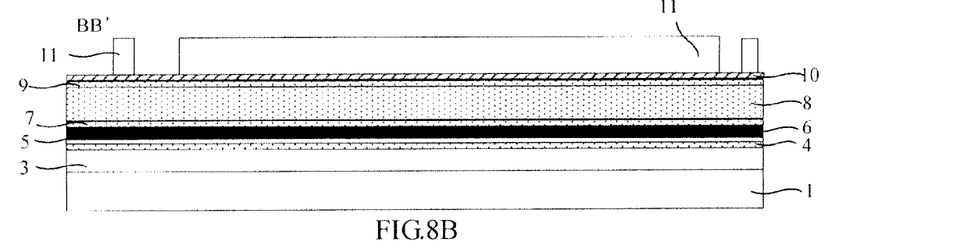
FIG. 8B is a schematic sectional view of each layer to be exposed with one mask plate after exposure of the photoresist, in the processes according to the specific example of the present invention, taken along the line BB' (in FIG. 3)

FIGS. 8A and 8B are schematic diagrams of the photoresist formed after exposure and development.

With a patterning process, the region corresponding to the photoresist-completely-removed region is patterned, that is, the laminate uncovered in this region is etched, so that a transparent electrode layer 10', a p-type amorphous-silicon layer 9', an intrinsic amorphous-silicon layer 8', an n-type amorphous-silicon layer 7', a data-line-and-source-drain metal layer 6', an ohmic contact layer 5', and an active layer 4' are formed.

Figure 9A:
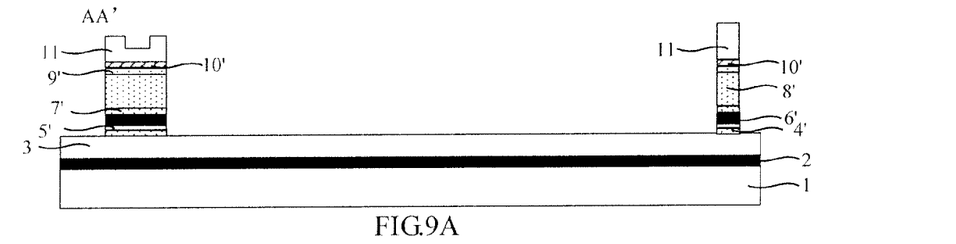
FIG. 9A is a schematic sectional view of each layer exposed with one mask plate after etching off the exposed portion, in the processes according to the specific example of the present invention, taken along the line AA' (in FIG. 3)
Figure 9B:
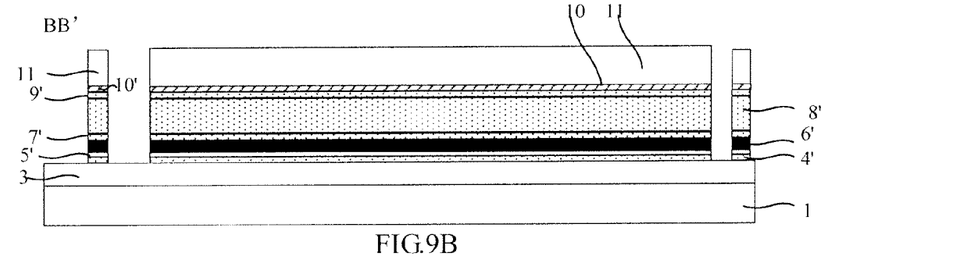
FIG. 9B is a schematic sectional view of each layer exposed with one mask plate after etching off the exposed portion, in the processes according to the specific example of the present invention, taken along the line BB' (in FIG. 3)

FIGS. 9A and 9B are schematic diagrams of the substrate after the patterning process.

Figure 10A:
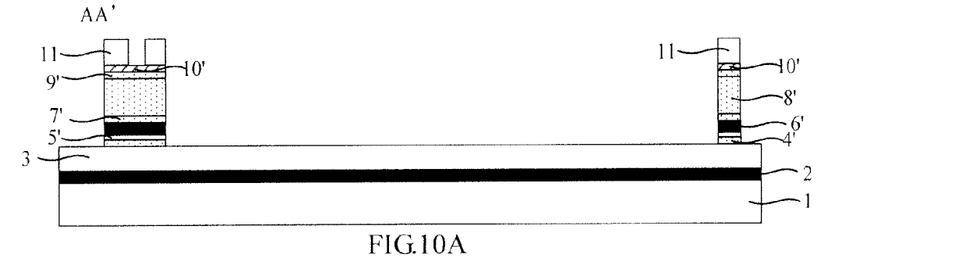
FIG. 10A is a schematic sectional view of each layer exposed with one mask plate after etching off the exposed portion, in the processes according to the specific example of the present invention, taken along the line AA' (in FIG. 3)
Figure 10B:
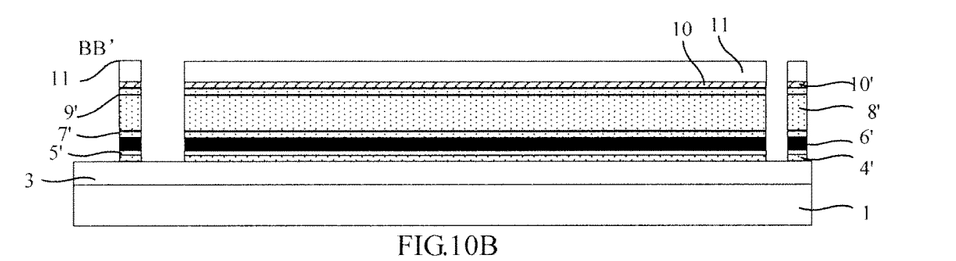
FIG. 10B is a schematic sectional view of each layer exposed with one mask plate after etching off the exposed portion, in the processes according to the specific example of the present invention, taken along the line BB' (in FIG. 3)
Figure 11A:
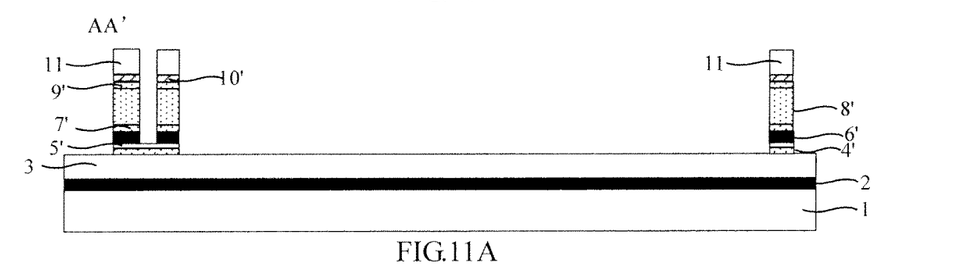
FIG. 11A is a schematic sectional view of each layer exposed with one mask plate after formation of a channel, in the processes according to the specific example of the present invention, taken along the line AA' (in FIG. 3)
Figure 11B:
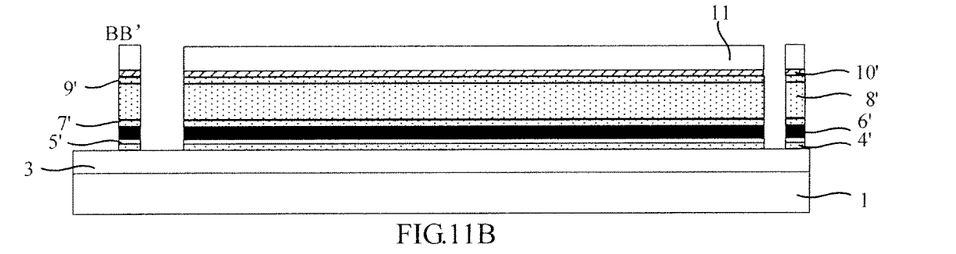
FIG. 11B is a schematic sectional view of each layer exposed with one mask plate after formation of a channel, in the processes according to the specific example of the present invention, taken along the line BB' (in FIG. 3)

An ashing process is performed onto the photoresist in the photoresist-partially-retained region, and this portion of photoresist is removed; meanwhile, the photoresist in the photoresist-fully-retained region is partially retained, as shown in FIGS. 10A and 10B. Then, with a patterning process, the region corresponding to the photoresist-partially-retained region is patterned, that is, the laminate that is newly uncovered is etched, so that a channel pattern is formed. FIGS. 11A and 11B are schematic diagrams of the substrate after formation of the channel.

Finally, the photoresist in the photoresist-fully-retained region is removed. Thus, through the patterning processes, the data line, the TFT switch element and the photosensitive element are formed.

Next, the amorphous-silicon layer on the data line and on the source-drain of the TFT switch element can be etched and removed. Because in this manufacturing method, the active layer, the ohmic contact layer, the data-line-and-source-drain metal layer and the amorphous-silicon layer are sequentially deposited layer by layer and then subjected to photolithography with a gray-tone mask plate, with only the one masking process the amorphous-silicon layer on the data line and on the TFT switch element still exists but is not necessary. The residual amorphous-silicon layer can be etched off with a patterning process, or can be remained on the data line and on the TFT switch element in consideration of saving a process step and manufacturing costs.

For example, the active layer film is n-type amorphous-silicon, but not limited to this, and for example, or may be any suitable material such as an oxide semiconductor. The use of n-type amorphous-silicon as a material of the active layer can achieve good electric conductivity.

For example, the active film layer has a thickness of 30 nm~300 nm.

For example, the ohmic contact layer film has a thickness of 30 nm~100 nm.

For example, the n-type amorphous-silicon layer film has a thickness of 30 nm~100 nm.

For example, the p-type amorphous-silicon layer film has a thickness of 30 nm~100 nm.

For example, the intrinsic amorphous-silicon layer film has a thickness of 100 nm~2000 nm.

The thickness of each layer film can be controlled within a certain range, and this can not only ensure the effective function of each layer, but also can avoid an influence on the function of each component due to large difference between the thicknesses of the layer films in the regions.

Figure 12A:
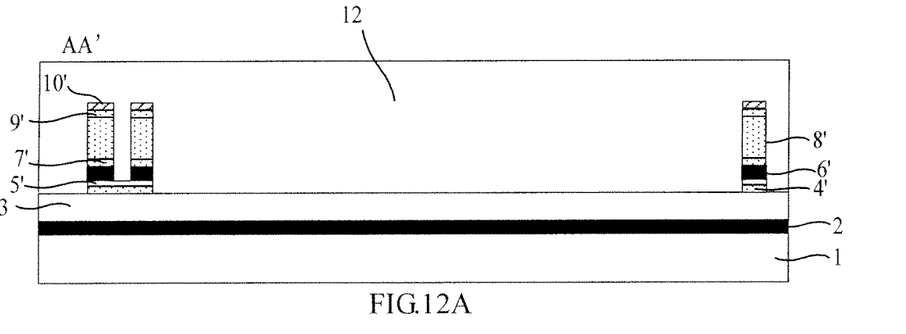
FIG. 12A is a schematic sectional view after formation of a passivation layer, in the processes according to the specific example of the present invention, taken along the line AA' (in FIG. 3)
Figure 12B:
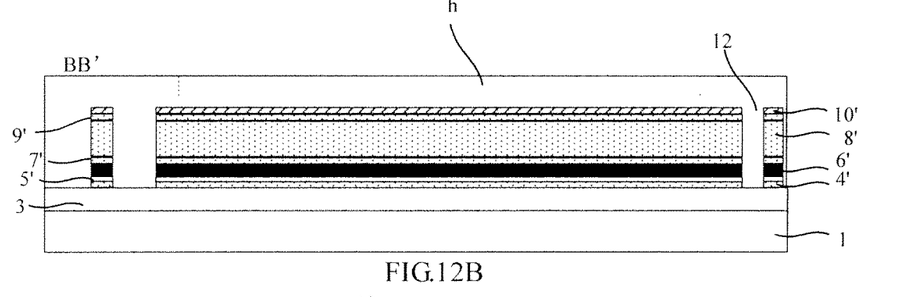
FIG. 12B is a schematic sectional view after formation of a passivation layer, in the processes according to the specific example of the present invention, taken along the line BB' (in FIG. 3)

Next, on the substrate after the above steps are completed, a passivation layer 12 is formed. FIGS. 12A and 12B are schematic diagrams after formation of the passivation layer.

A specific example of this step is described as below.

A passivation layer film 12 is formed on the entire substrate 1, as shown in FIGS. 12A and 12B and as well as FIG. 3. A layer of photoresist (not shown) is formed on the passivation layer film 12.

With a mask plate, the photoresist corresponding to the data line region a, the photosensitive element region c, and the via hole region h in the gate scan line region f, is exposed.

With a patterning process, the passivation layer film in the region corresponding to the data-line region is removed, also the passivation layer film in the region corresponding to the photosensitive element is removed, and further the passivation layer film in the region corresponding to the via region h in the gate scan line region f is removed. This allows the transparent electrode layer 10 within a via hole to be uncovered.

The passivation layer film in the switch element is preferably a resin or silicon nitride. The use of silicon nitride as a raw material of the passivation layer can provide a very good insulating effect. The passivation layer made of a resin is able to more easily realize an uniform covering effect, and more easily have a flat surface; it should be known to those skilled in the art that, any other material having the same effects as a resin or a silicon nitride also may be used, and the present invention is not limited in this regard.

For example, the passivation layer film has a thickness of 150 nm~2500 nm. The thickness of the passivation layer film is controlled within this range, which ensures the effective insulation of the passivation layer, and will not result in a too-high step due to a too-large thickness.

Finally, a bias line is formed on the passivation layer 12.

Figure 13A:
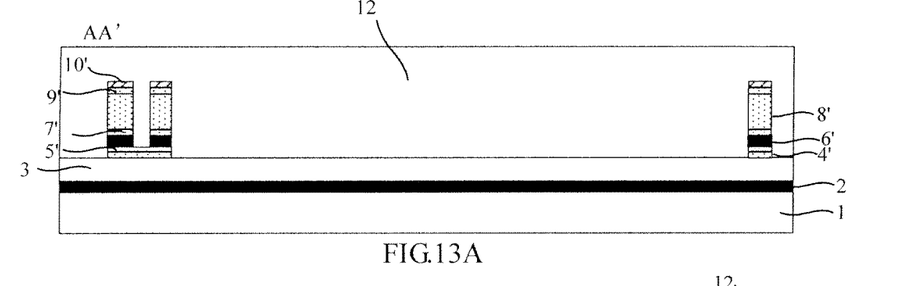
FIG. 13A is a schematic sectional view after formation of a bias line, in the processes according to the specific example of the present invention, taken along the line AA' (in FIG. 3)
Figure 13B:
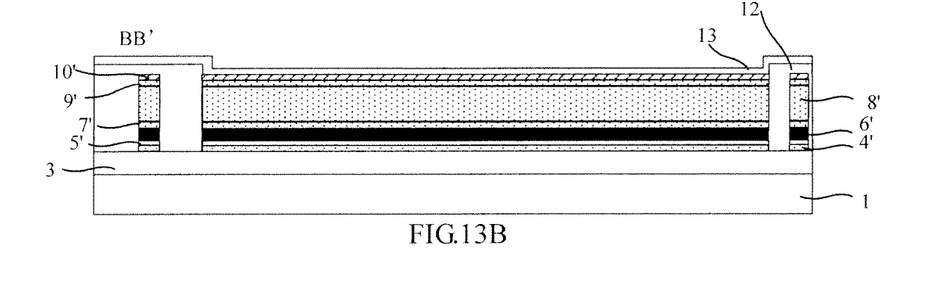
FIG. 13B is a schematic sectional view after formation of a bias line, in the processes according to the specific example of the present invention, taken along the line BB' (in FIG. 3).

On the substrate after the above steps are completed, a bias-line thin film is formed, and through a patterning process, a bias line is formed. The patterning process comprises processes such as masking, exposing, developing, etching, etc.; and it is also possible that the patterning process may be not conducted by the processes of first forming a thin film for each film layer on a substrate and then performing a photolithography process; instead, it may adopt a process such as printing, screen printing, etc, to directly form a pattern of each film layer on the substrate. FIGS. 13A and 13B are schematic diagrams after formation of the bias line 13.

The bias line is used for providing a bias voltage. The bias lines of the respective sensors in a sensor-array need to be interconnected and led to a periphery portion. In this embodiment, the bias line may be made into a comb shape or may be made into a block shape (in this case, any two adjoining block-shaped bias lines are connected to each other), or the entire sensor array region may be covered in a large area. The bias line is as shown in FIG. 13A, and the bias line is in connection with the transparent electrode layer film 10 through the via hole h by contracting.

The bias lines near the pin-area of the lead wirings in the periphery of the sensors must be etched off to avoid short-circuit with the respective pins. The etching and removing of the bias lines near the pin-area of the lead wirings in the periphery of the sensors, can be performed in the masking, exposing, developing, etching, etc for forming the bias line, or can be conducted in an individual etching step.

The bias line layer film may be a conductive transparent film made of ITO (indium-tin oxide) or IZO (indium-zinc oxide).

Here, ITO is preferably deposited in a room-temperature amorphous deposition mode; a high-temperature polycrystalline deposition mode will cause the photoresist on the substrate to be cured and degraded and thus become difficult to be stripped off. Finally, the amorphous ITO is subjected to an annealing process and converted into polycrystalline ITO having better electric-conductivity and higher light transmission. The annealing process refers to such a process that ITO is heated to a certain threshold temperature and maintained for a certain period of time, and then slowly cooled down.

For example, the bias-line thin film has a thickness of 30 nm~120 nm. The thickness of the bias-line thin film is controlled within this range, which can ensure the electric-conductivity of the bias line, and will not result in a too-high step due to a too-large thickness of the bias line.

The amorphous-silicon flat-panel X-ray sensor manufactured by the manufacturing method of the present invention is as shown in FIG. 3, FIG. 13A and FIG. 13B.

The amorphous-silicon flat-panel X-ray sensor comprises: the data line a, the TFT switch element b, the photosensitive element c, and the gate scan line f. The TFT switch element comprises: the gate electrode, the active layer, the ohmic contact layer, the source and the drain.

In the manufacturing method of the embodiment of the invention, the active layer, the ohmic contact layer, the data-line-and-source-drain metal layer, the amorphous-silicon layer, and the transparent electrode layer are sequentially deposited layer by layer and then subjected to photolithography with a gray-tone mask plate, thus only one masking process for etching and patterning is conducted. So, the amorphous-silicon layer on the data line and on the TFT switch element still exists but not necessary; and the residual amorphous-silicon layer can be etched off with a patterning process, or can be remained on the data line and on the TFT switch element in consideration of saving a process step and manufacturing costs.

The amorphous-silicon layer comprises the laminate comprising a n-type amorphous-silicon layer, an intrinsic amorphous-silicon layer, and a p-type amorphous-silicon layer.

In the embodiment of the present invention, during the formation of the data line, the TFT switch element and the photosensitive element, only one masking process is required, and with a gray-tone mask plate, photoresist covering different regions is subjected to different degrees of exposure, i.e., fully-exposure, half-exposure and non-exposure. In this way, it is possible to use only one masking process to form a data line, a TFT switch element and a photosensitive element, and this not only simplifies the production processes, saves the production costs, but also improves the product yield.

It is apparent to those skilled in the art that various modifications and variations can be made to the present invention without departing from the spirit and scope of the invention. Thus, these modifications and variations are intended to be also encompassed by the scope of the present invention.

The invention claimed is:

1. A manufacturing method of an amorphous-silicon flat-panel X-ray sensor, comprising:
   on a substrate, forming a pattern including a gate electrode and a gate scan line;
   on the gate electrode and the gate scan line, forming a data line, a thin-film transistor (TFT) switch element and a photosensitive element, wherein the photosensitive element comprises an amorphous-silicon layer; and
   on the data line, the TFT switch element and the photosensitive element, forming a passivation layer and a bias line electrically connected to the photosensitive element.

2. The manufacturing method of an amorphous-silicon flat-panel X-ray sensor according to claim 1, wherein forming of a data line, a TFT switch element and a photosensitive element on the substrate formed with the gate electrode and the gate scan line comprises:
   forming the data line, the TFT switch element and the photosensitive element through one masking process, wherein on a mask plate used in the masking process, a region corresponding to a channel of the TFT switch element is semi-transmissive and used to obtain a photoresist-partially-retained region; a region corresponding to the data line, the photosensitive element and a portion in the TFT switch element other than the channel thereof is non-transmissive and used to obtain a photoresist-fully-retained region; and, except the region corresponding to the channel of the TFT switch element, the region corresponding to the data line and the region corresponding to the photosensitive element, a rest region is fully-transmissive and used to obtain a photoresist-completely-removed region.

3. The manufacturing method of an amorphous-silicon flat-panel X-ray sensor according to claim 2, wherein forming of a data line, a TFT switch element and a photosensitive element through one masking process comprises:
   on the substrate formed with the gate electrode and the gate scan line, sequentially forming a gate insulating layer film, an active layer film, an ohmic contact layer film, a data-line-and-source-drain metal layer film, an amorphous-silicon layer film, a transparent electrode layer film, and a photoresist layer film;
   with the mask plate used in the masking process, exposing and developing the photoresist layer so that a photoresist pattern is obtained, which comprises the photoresist-completely-removed region, the photoresist-partially-retained region and the photoresist-fully-retained region;
   in the photoresist-completely-removed region, etching off the transparent electrode layer film, the amorphous-silicon layer film, the data-line-and-source-drain metal layer film, the ohmic contact layer film and the active layer film; then, in the photoresist-partially-retained region, removing the photoresist to uncover the channel, and in the uncovered region, etching the transparent electrode layer film, the amorphous-silicon layer film and the source-drain metal layer film to form the channel of the TFT switch element; and then, in the photoresist-fully-retained region, removing the photoresist so that the data line, the TFT switch element and the photosensitive element are uncovered.

4. The manufacturing method of an amorphous-silicon flat-panel X-ray sensor according to claim 3, wherein after etching the transparent electrode layer film, the amorphous-silicon layer film and the data-line-and-source-drain metal layer film in the uncovered region in the photoresist-partially-retained region to form the channel of the TFT switch element, the method further comprises:
   etching off the amorphous-silicon layer film on the data-line-and-source-drain metal layer of the TFT switch element.

5. The manufacturing method of an amorphous-silicon flat-panel X-ray sensor according to claim 3, wherein the amorphous-silicon layer comprises, sequentially laminated, an n-type amorphous-silicon layer, an intrinsic amorphous-silicon layer, and a p-type amorphous-silicon layer.

6. The manufacturing method of an amorphous-silicon flat-panel X-ray sensor according to claim 1, wherein the gate electrode and the gate scan line are made of molybdenum, aluminum, tungsten, titanium, copper, or an alloy of any two of the aforementioned metals, and in a monolayer film or a multilayer film, and have a thickness of 100 nm~500 nm.

7. The manufacturing method of an amorphous-silicon flat-panel X-ray sensor according to claim 3, wherein the gate insulating layer film is made of silicon nitride or silicon oxide, and has a thickness of 250 nm~600 nm.

8. The manufacturing method of an amorphous-silicon flat-panel X-ray sensor according to claim 3, wherein the active layer film is made of n-type amorphous-silicon, and has a thickness of 30 nm~300 nm.

9. The manufacturing method of an amorphous-silicon flat-panel X-ray sensor according to claim 3, wherein the ohmic contact layer film has a thickness of 30 nm~100 nm.

10. The manufacturing method of an amorphous-silicon flat-panel X-ray sensor according to claim 3, wherein in the amorphous-silicon thin film, the n-type amorphous-silicon thin-film layer has a thickness of 30 nm~100 nm, and the intrinsic amorphous-silicon thin-film layer has a thickness of 100 nm~2000 nm.

11. The manufacturing method of an amorphous-silicon flat-panel X-ray sensor according to claim 1, wherein forming of a passivation layer and a bias line on the substrate formed with the TFT switch element and the photosensitive element comprises:

on the substrate formed with the TFT switch element and the photosensitive element, forming the passivation layer through one masking process, wherein the mask plate used in the masking process is non-transmissive except a photosensitive-element region and a via hole region; and forming the bias line on the passivation layer.

12. The manufacturing method of an amorphous-silicon flat-panel X-ray sensor according to claim 11, wherein the passivation layer film in the switch element is made of non-photosensitive resin, silicon nitride or silicon oxide, and has a thickness of 150 nm~2500 nm.

13. The manufacturing method of an amorphous-silicon flat-panel X-ray sensor according to claim 11, wherein the bias line layer film is made of indium-tin oxide (ITO) or indium-zinc oxide (IZO), and has a thickness of 30 nm~120 nm.

14. The manufacturing method of an amorphous-silicon flat-panel X-ray sensor according to claim 4, wherein the amorphous-silicon layer comprises, sequentially laminated, an n-type amorphous-silicon layer, an intrinsic amorphous-silicon layer, and a p-type amorphous-silicon layer.

15. The manufacturing method of an amorphous-silicon flat-panel X-ray sensor according to claim 12, wherein the bias line layer film is made of indium-tin oxide (ITO) or indium-zinc oxide (IZO), and has a thickness of 30 nm~120 nm.

* * * * *